(12) United States Patent
Jevtic et al.

(10) Patent No.: US 6,684,123 B2
(45) Date of Patent: Jan. 27, 2004

(54) METHOD AND APPARATUS FOR ACCESSING A MULTIPLE CHAMBER SEMICONDUCTOR WAFER PROCESSING SYSTEM

(75) Inventors: Dusan Jevtic, Santa Clara, CA (US); Raja Sunkara, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 175 days.

(21) Appl. No.: 09/893,220

(22) Filed: Jun. 26, 2001

(65) Prior Publication Data

US 2003/0000468 A1 Jan. 2, 2003

(51) Int. Cl.[7] .......................... G06F 19/00; B65G 49/07
(52) U.S. Cl. ..................... 700/121; 700/95; 700/117; 438/800; 414/935; 414/940
(58) Field of Search .................... 700/121, 95, 117; 438/800; 427/96; 414/217, 939, 935–941

(56) References Cited

U.S. PATENT DOCUMENTS

| | | | |
|---|---|---|---|
| 5,928,389 A | 7/1999 | Jevtic | 29/25.01 |
| 6,157,866 A | 12/2000 | Conboy et al. | 700/121 |
| 6,340,405 B2 * | 1/2002 | Park | 156/345.32 |
| 6,382,895 B1 * | 5/2002 | Konishi et al. | 414/217 |

OTHER PUBLICATIONS

Copy of International Search Report dated May 30, 2003 for corresponding PCT application, PCT/US02/20090.

* cited by examiner

Primary Examiner—Jayprakash N. Gandhi
(74) Attorney, Agent, or Firm—Moser Patterson & Sheridan (57) ABSTRACT

A factory interface for a multiple chamber semiconductor wafer processing cluster tool having a K-wafer load-lock (KWLL). The KWLL comprises a variable number of K+1 wafer slots assigned as inbound and outbound slots. Inbound slots are used to send up to K+1 wafers into the cluster tool and the same slots, denoted as outbound slots, are used for receiving up to K+1 wafers from the cluster tool. The K+1 slots are in the same volume that has to be pumped for wafers to enter the tool and vented for wafers that to leave the tool. These K+1 slots accommodate up to K wafers when accessed by a single blade robots from the tool or the factory interface, and up to K+1 wafers when the tool and factory interface are equipped with dual blade robots. Various KWLL loading methods can be selected to optimize the throughput of a wafer processing system using the KWLL. Such methods include wafer packing, reactive and gamma tolerant methods.

8 Claims, 7 Drawing Sheets

METHOD AND APPARATUS FOR ACCESSING A MULTIPLE CHAMBER SEMICONDUCTOR WAFER PROCESSING SYSTEM

BACKGROUND OF THE INVENTION

1. Field of the Invention

The present invention generally relates to a multiple chamber semiconductor wafer processing system and, more specifically, the present invention relates to a method and apparatus for accessing a multiple chamber semiconductor wafer processing system.

2. Description of the Related Art

In integrated circuit (IC) manufacturing systems that handle 200 mm wafers, the interface to the factory is a 25-wafer load-lock. The load-lock forms an entry and exit point for the IC manufacturing system. In use, a cassette carrying 25 wafers is placed into a load-lock and the air in the load-lock is removed to form a vacuum in the load-lock. The wafer cassette is vertically positioned in the load-lock to align a particular wafer with a wafer transport mechanism, e.g., a wafer transport robot.

The time required to produce a vacuum in the load-lock is referred to herein as $T_{pump}$. After processing within the IC manufacturing system, the processed wafer is returned to the cassette. When all the wafers have been processed and returned, the air in the load-lock is then let into the load-lock at a controlled rate in what is referred to as a vent operation. The time required to perform a vent operation is referred to herein as $T_{vent}$. Once venting is complete, the cassette is removed from the load-lock. The maximum achievable load-lock throughput is represented as:

$$S_{LL} = \frac{2K}{T_{pump} + T_{vent} + T_{load} + T_{unload}}$$

where:

K is the maximum number of wafers in the load-lock;

$T_{pump}$ is the time required to evacuate the load-lock;

$T_{vent}$ is the time required to fill the load-lock with air;

$T_{load}$ is the time required to load a cassette into the load-lock; and $T_{unload}$ is the time required to unload a cassette from the load-lock.

Load-locks are generally double-buffered by using a pair of parallel load-locks that feed wafers to a wafer processing system. As such, loading, pumping, venting, and unloading of one cassette is overlapped with processing of wafers from another cassette. Without double-buffering, no overlap is possible and the time required to pump and vent a load-lock can be almost as long as the wafer processing time.

Figure 1:
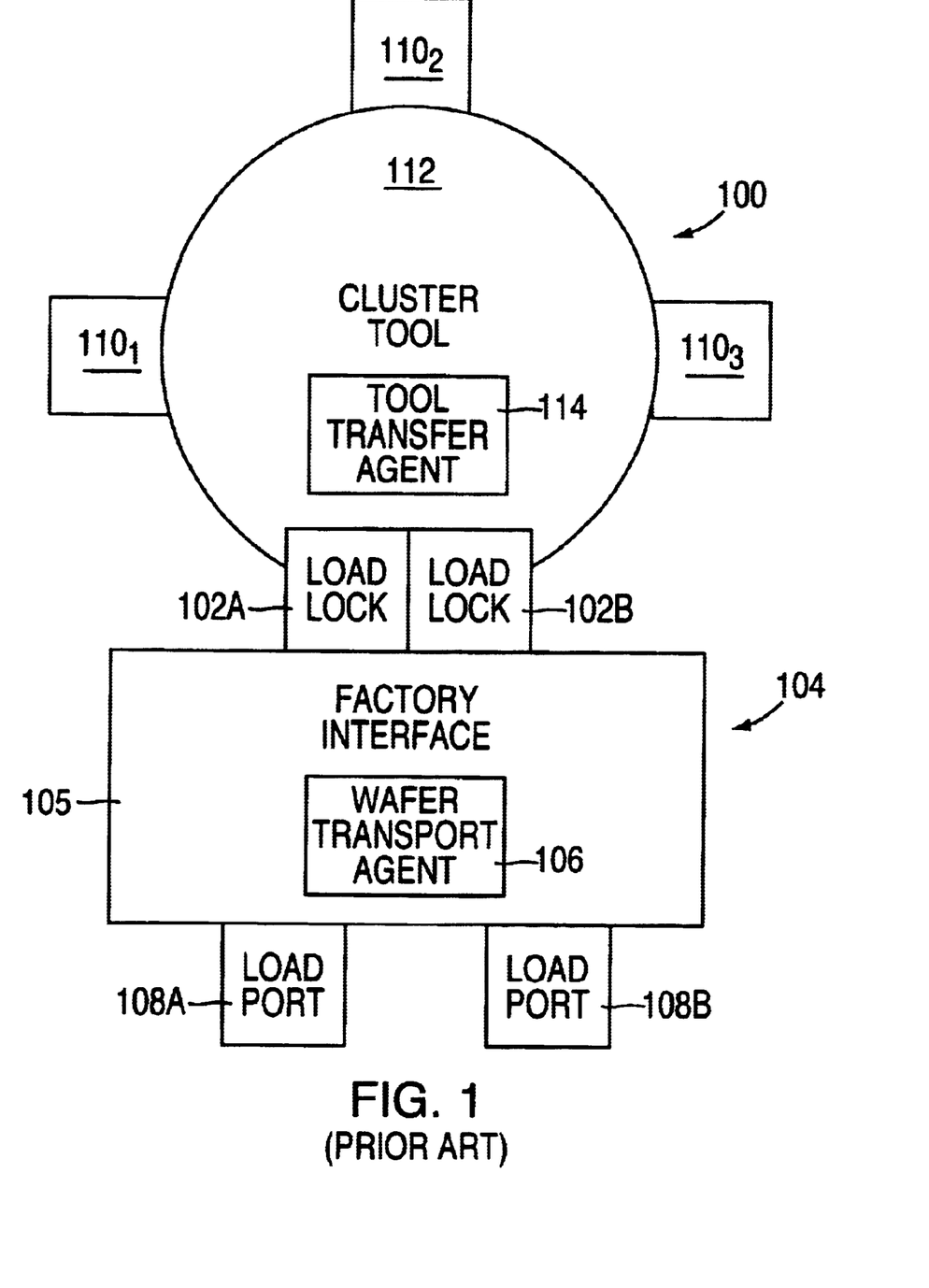
FIG. 1 depicts a schematic diagram of a prior art semiconductor wafer processing system having a single wafer load-lock.

FIG. 1 depicts a semiconductor wafer processing system or cluster tool 100 for 300 mm wafers comprising a plurality of process chambers $110_1$, $110_2$, $110_3$, and a transfer chamber 112. The cluster tool 100 is coupled to a factory interface 104. The FI 104 comprises a pair of single wafer load-locks (SWLLs) 102A and 102B, FI transfer space 105 containing a wafer transport agent 106, and at least one load port (two are depicted as ports 108A and 108B). The FI 104 may optionally comprise a wafer orientor, a pass-through slot, one or more cool down positions, a metrology station, or defect control station.

A tool transfer agent 114 (commonly referred to as a robot) accesses the chambers $110_1$, $110_2$, $110_3$ and the load-locks 102A, 102B to move wafers amongst the chambers and load-locks. The SWLL 102A and 102B are used as the entry and exit points to the tool 100. The load-locks 102A and 102B each retain only one wafer at a time during the pump/vent cycle.

The FI load ports 108A and 108B are supplied with wafer cassettes that hold up to 25 wafers each. When a transfer agent 106 having a single wafer transport blade is used in either the tool 100 or in the FI 104, the SWLLs have two slots each. Using two slots enables a single blade robot (SBR) to wait for an SWLL to either pump or vent while being pre-positioned in front of the SWLL with a wafer on its blade. The robot then puts the wafer in an empty slot first before taking a wafer out of the SWLL. With two slots, the load and unload times are substantially decreased. However, the load-lock volume is increased to accommodate the second slot which increases pump and vent times.

When dual blade robots are used in both the tool 100 and the FI 104, then only a single slot SWLL is used and load-lock volume is reduced. The second blade serves as a buffer that accepts a wafer from the SWLL before placing a new wafer from the other blade of the robot into the SWLL.

Wafers from the FI load ports 108A or 108B are directed toward either SWLL 102A or 102B depending upon which SWLL is available to be loaded. If both SWLLs are available, the wafer enters the nearest SWLL to the current position of the transfer agent 106. Wafers leaving the transfer chamber 112 of the tool 100 are directed into either SWLL 102A or 102B depending upon which SWLL is available. If both SWLL are available, the wafer enters the one nearest the present position of the tool transfer agent 114. The FI 104 returns the wafer to the source cassette into its original position, i.e., preserving slot integrity. Wafers that enter the transfer chamber 112 through SWLL 102A are not restricted to exiting the transfer chamber 112 through SWLL 102A. Similarly, wafers from one cassette can enter either SWLL 102A or 102B depending on the load-lock availability. In other words, unless explicitly restricted by the system controller software, wafers from one cassette are not restricted from entering and leaving the tool via a particular load-lock.

The fixed nature of the number of slots to either one or two can result in substantial transfer delays for wafers entering and leaving a cluster tool. Therefore, there is a need in the art for a method and apparatus to improve wafer throughput in semiconductor wafer processing systems that use load-locks.

SUMMARY OF THE INVENTION

The present invention is a factory interface for a semiconductor wafer processing cluster tool having a K-wafer load-lock (KWLL) to facilitate accessing a multiple chamber semiconductor wafer processing system. The KWLL comprises a variable number of K+1 wafer slots assigned as inbound and outbound slots. Inbound slots are used to send up to K+1 wafers into the cluster tool and the same physical slots, denoted as outbound slots, are used for receiving up to K+1 wafers from the cluster tool. The K+1 slots are in the same volume that has to be pumped for wafers to enter the tool and vented for wafers to leave the tool. These K+1 slots accommodate up to K wafers when accessed by a single blade robot from the tool or the factory interface, and up to K+1 wafers when the tool and factory interface are equipped with dual blade robots. Various KWLL loading methods can be selected to optimize the throughput of a wafer processing system using the KWLL. Such methods illustratively include a wafer packing method, a reactive method and a gamma tolerant method.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention is a method and apparatus for transferring wafers to and from a semiconductor wafer processing cluster tool using a K-wafer load-lock (KWLL), where K is an integer that is greater than zero. Various methods are used to optimize the throughput of wafers through the KWLL.

Figure 2:
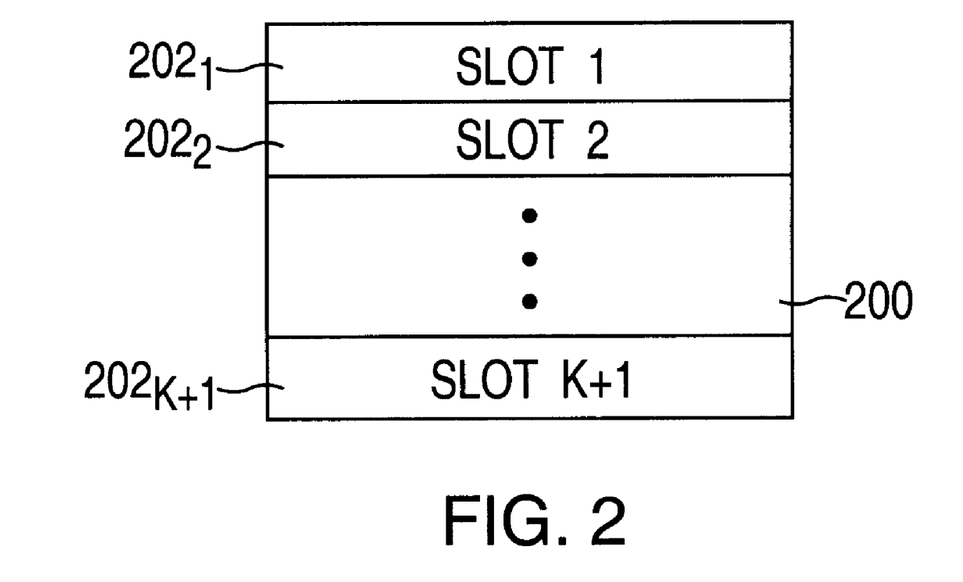
FIG. 2 depicts a schematic representation of a K-wafer load-lock (KWLL)

FIG. 2 depicts a schematic representation of a KWLL 200 comprising K+1 slots $202_1$, $202_2$ through $202_{K+1}$. Each slot 202 is intended to horizontally support and retain one wafer as the wafer is transferred from the factory interface (FI) transfer agent 106 in FIG. 1 to the tool transfer agent 114. A pair of KWLLs 200 are intended to replace both SWLL 102A and 102B in FIG. 1.

The KWLL 200 utilizes a variable number of K+1 wafer slots assigned as inbound and outbound. Inbound slots are used to send up to K+1 wafers into the cluster tool and the same physical slots, denoted as outbound, are used for receiving up to K+1 wafers from the cluster tool 100. The K+1 slots are in the same volume that has to be pumped for wafers to go in and vented for wafers to go out of the tool. These K+1 slots are supposed to accommodate up to K wafers when a single blade robots (tool's and FI's transport agent) and up to K+1 wafers when both the tool and FI transfer spaces are equipped with dual blade robots.

As shall be discussed below, using the KWLL 200, where 1<K<25, improves system throughput relative to using either an SWLL or a 25-wafer cassette-based load-lock. To facilitate increased throughput, the K-wafer load-lock pump and vent times may be matched to a given tool throughput, FI process and load/unload time, and the number of wafers inside the tool. For example, it can be shown by simulation that for a wafer flow, LoadPort→O→LL→(Etch, Etch, Etch)→LL→LoadPort and using a 3-wafer slot load-lock (K=2), offers an improvement in throughput of 22% over SWLL performance. In this simulation, it is assumed that the 3-slot load-lock has a volume that is double that of the SWLL and pump-vent times increase linearly with volume). In the above flow graph, O is an orient position in FI having "processing time" of nine seconds, etch chambers have a processing time of 120 seconds each, and pump and vent time for the KWLL are assumed to be 30 seconds each. The scheduling algorithm used in both the tool and the FI is reactive scheduling (as described below). As is described below, matching the scheduling algorithm, load-lock capacity, and its loading policy to the system's (FI 104 plus tool 100) configuration and parameters is the least expensive way to considerably improve the system's throughput.

In a system composed of a cluster tool 100, KWLL 200, and FI 104, both performance of each individual subsystem as well as their mutual interactions are important. Consider separately, as depicted in FIG. 1 using the KWLL of FIG. 2, the throughput bottleneck to be avoided must be the tool 100 because it is, by far, the most expensive component and should be utilized at all times, i.e., 100% utilization. That is, in no case are either the FI or the KWLL to hinder the system's operation. KWLL 200 can be viewed as a "gate" large enough so that the cluster tool 100 never waits for another wafer from the FI 104. If we denote by $S_{TOOL}$ and $S_{FI}$ average throughputs of the cluster tool 100 and its FI 104, respectively, the $S_{TOOL} << S_{KWLL}$ and $S_{FI} << S_{KWLL}$ and $S_{TOOL} < S_{FI} < S_{KWLL}$. In addition to throughput requirements, the system's dynamics must be such that the tool 100 never waits for wafers from the FI 104. System dynamics are best indicated through the value of variance of pertinent steady-state variables. The variability of the system throughput is implied by the system configuration, slight randomness in the robot, the chamber, and the load-lock parameters, the execution of scheduling logic and the load-lock loading policy, and so on.

Let $C_{TOOL}$ and $C_{LLOCK}$ denote the capacity of a tool 100 and load-lock 200, respectively. That is, if the tool 100 has $C_{TOOL}$ wafers in it, additional unprocessed wafers need to wait either in the load-lock or in the FI or in a cassette outside the system. It is the ratio of $C_{TOOL}/C_{LLOCK}$ that determines the number of pump-vent cycles a load-lock needs to perform in order to fill-up the tool or to empty the tool of wafers belonging to a given product. There are two boundary effects of interest in wafer exchange from the FI 104 into the tool 100 and vice versa. One is when an empty tool starts filling up with wafers (up to $C_{TOOL}$ of them) in order to start processing. Another is when a tool is to be emptied of wafers that belong to a certain product; it takes approximately $C_{TOOL}/C_{LLOCK}$ pumps and vents to empty the tool of wafers. A minimum number of pumps and vents to do this job can be found in order not to pump and vent empty load-locks more times than necessary.

There are two limiting cases here worth mentioning. In 200 mm wafer processing equipment, 25-wafer cassettes are placed into (usually dual-buffered) load-locks. Unprocessed wafers are taken from a cassette and, after visiting one or more process and/or metrology chambers, they are returned into the same position in the cassette they came from. Here, $C_{TOOL}/C_{LLOCK}$ is always smaller than one (in many cases much smaller) so that there are no multiple pumps and vents in order to either fill-up or to empty the tool. The case is thus trivial. Put a cassette into a load-lock, wait until wafers are processed, and take the cassette out. Another limiting case is a single wafer load-lock (SWLL) deployed in 300 mm tools. Here $C_{TOOL}/C_{LLOCK}=C_{TOOL}$ and thus $C_{TOOL}$ pumps/vents are needed in the transient period in order to fill/empty the tool.

Intuitively, there are two integers of interest here. First is a remainder, denoted by R and defined as $$R := C_{TOOL} \bmod C_{LLOCK}$$

in the integer division of tool and load-lock capacities. The second integer of interest, denoted by D (stands for Divisor), is defined as, $$D := C_{TOOL} \operatorname{div} C_{LLOCK}$$

We are interested in cases when D>0 and $C_{LLOCK}$>1. Note that D+1 load-lock trips are needed before transient period is over. If R=0, then D trips to the FI robot space are needed.

Hence, the time to fill-up $C_{TOOL}$ chambers by using two single-wafer load-locks is given by $$(D+1)(T_{pump}+T_{vent}+T_{load}+T_{unload})=2(D+1)/S_{SWLL}$$

where $S_{SWLL}$ is the throughput of single-wafer load-lock. When K-wafer load-lock is used, this time is given by $$T_{pump}^{(K)}+T_{vent}^{(K)}+T_{load}^{(K)}+T_{unload}^{(K)}.$$

As already observed when comparing throughputs, the above sum for K-wafer load-lock can be considerably smaller than time needed to fill up the system of $C_{TOOL}$ chambers by using an SWLL.

There are two transient periods of interest here. First is when the tool is being loaded from empty to its steady-state. Second is when tool is being emptied from steady state. In either case, the logic (algorithms) used in bringing the wafers into the tool and removing them should satisfy the following set of constraints:

1. A load-lock should never return (i.e., from tool's robot space into the FI robot space) with unprocessed wafers in it. The control logic should not be the cause of returning the unprocessed wafers.
2. Minimize the number of times a load-lock either pumps or vents while empty.
3. Maximize the system throughput while satisfying the constraints on the length of stay of processed wafers in their respective chambers.

Intuitively, the solution to this problem should depend on the type of wafer flow (i.e., serial, parallel, mixed, knotted), the number and type of chambers as well as on the number and type of robots.

In considering the solution satisfying the above criteria, essential to the solution is signaling (communication) between load-locks. For example, the system starts with an empty tool and loads K wafers into a first KWLL. The system signals that the system has $C_{TOOL}$-K empty chambers to a second load-lock. The second KWLL is loaded with another K wafers and so on until the tool is filled with $C_{TOOL}$ wafers. The present invention uses a similar signaling between load-locks (i.e., handshaking) when the tool is being emptied as well as during the steady state operation.

Figure 3:
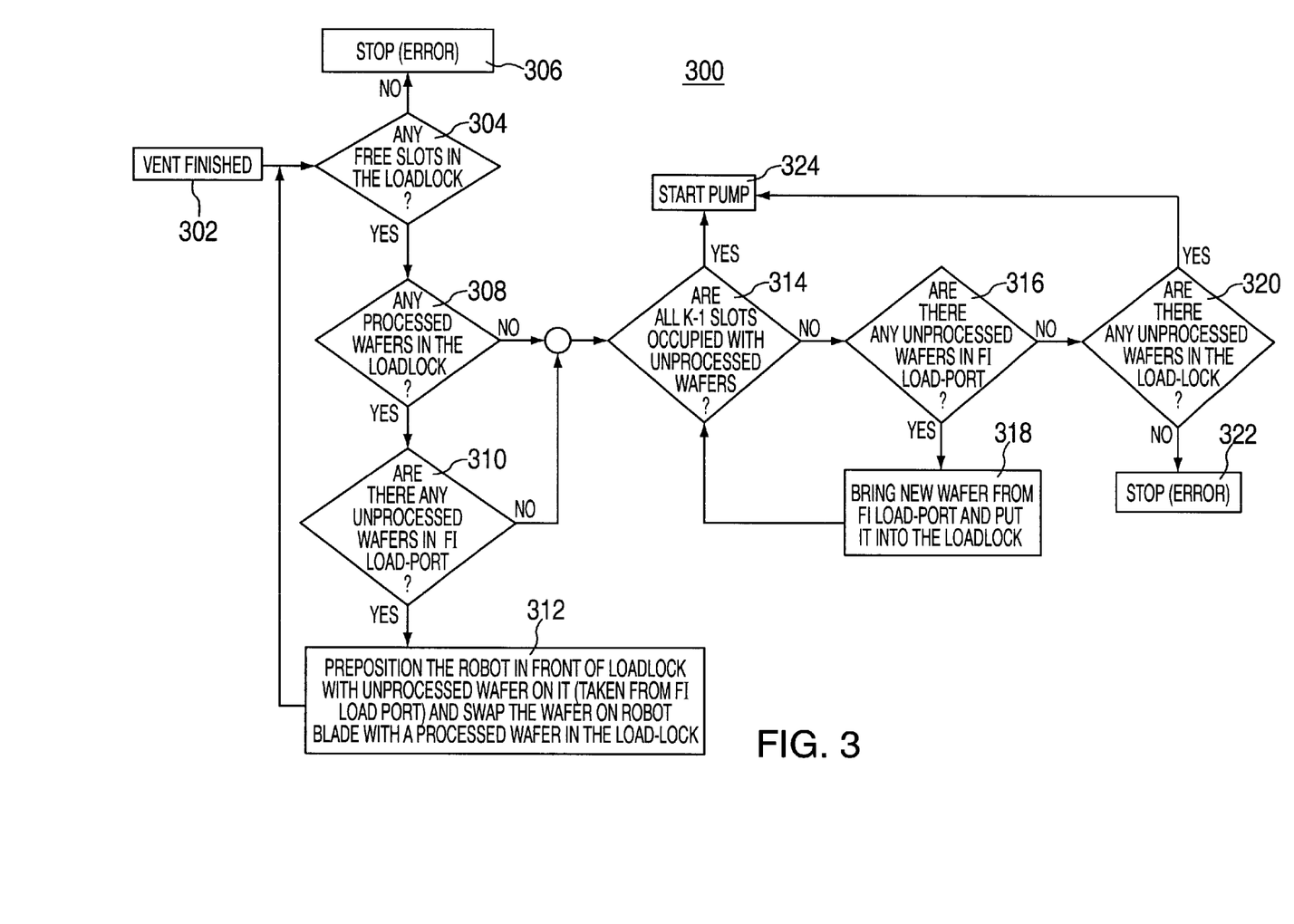
FIG. 3 depicts a flow diagram of an embodiment of a method of transferring a wafer through a KWLL using a single blade robot.

FIG. 3 depicts a method 300 for transferring wafers in the FI transfer space 105 using a single blade robot (SBR) as the transport agent. The method 300 begins at step 302 when a vent process is completed. At step 304, the method 300 queries whether there are any free slots in the KWLL. If the query is negatively answered, the method stops due to an error at step 306. Since this method operates using a single blade robot, the KWLL is supposed to only hold K wafers in K+1 slots such that one slot is always available as a buffer. If no slots are available, an error is indicated.

If, at step 304, the query is affirmatively answered, the method proceeds to step 308 where the method 300 queries whether any processed wafers are in the KWLL. If the query is affirmatively answered, the method 300 proceeds to step 310 where the method queries whether there are any unprocessed wafers in the FI load port. If the query is affirmatively answered, the method proceeds to step 312 where the robot retrieves an unprocessed wafer from the FI load port and is prepositioned in front of the KWLL. The robot then swaps the unprocessed wafer for a processed wafer and returns to step 304. Steps 304, 308, 310 and 312 are repeated until no processed wafers remain in the KWLL or no unprocessed wafers are available from the load port of the FI.

If the query of either steps 308 or 310 are negatively answered, the method 300 proceeds to step 314. At step 314, the method 300 queries whether all K–1 slots are occupied by unprocessed wafers. If all K–1 slots contain unprocessed wafers, the KWLL is deemed full and a pumping cycle is started at step 324. If the query at step 314 is negatively answered, the method proceeds to step 316 where the method queries whether any unprocessed wafers are in the FI load port. If wafers remain in the load port, the method proceeds to step 318 to move an unprocessed wafer to the KWLL and then returns to step 314. Steps 314, 316, and 318 fill any empty slots with wafers. If the query at step 316 is negatively answered, then there are no more wafers available from the load port and the method proceeds to step 320. Step 320 queries whether there are any unprocessed wafers in the KWLL. If the wafers are processed, or there are no wafers, the method stops at step 322. If there are unprocessed wafers in the KWLL (although not all K–1 slots are filled), the method proceeds from step 320 to step 324 to pump the KWLL to vacuum.

The foregoing process ensures a controlled and efficient use of the KWLL to maximize throughput of wafers being transported from the FI load port to the KWLL and vice versa.

Figure 4:
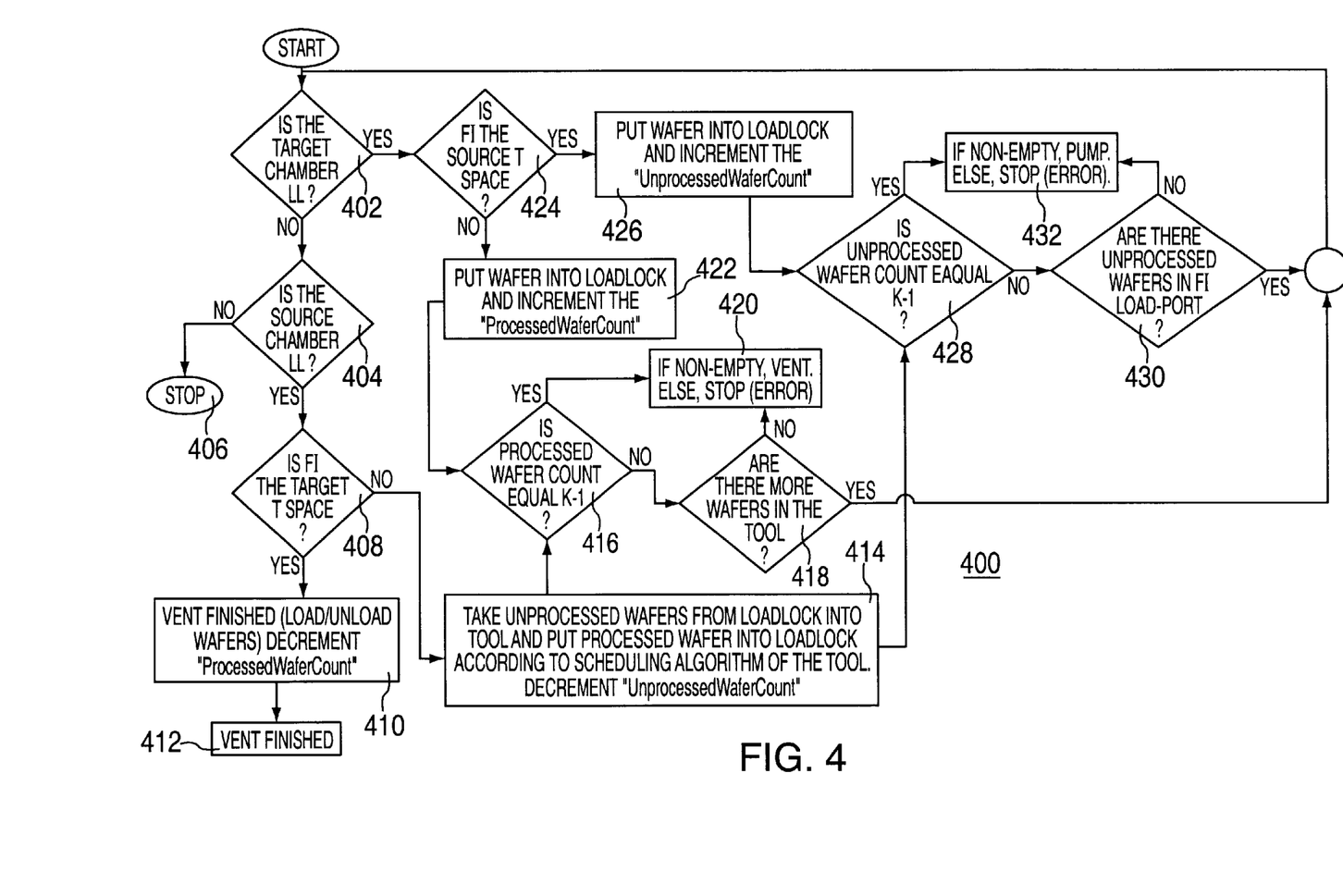
FIG. 4 depicts a flow diagram of an alternate embodiment of a method of transferring a wafer into a KWLL.

FIG. 4 depicts a flow diagram of a method 400 for controlling the movement of wafers into and out of a KWLL when the KWLL is either the source or the destination for the wafer. At step 402 the method queries whether the target chamber is the KWLL for a particular wafer. If the query, at step 402, is negatively answered, the method proceeds to step 404 wherein the method queries whether the KWLL is the source chamber for the wafer. If the query, at step 404, is negatively answered, the method stops at step 406. If the query, at step 404, is affirmatively answered, then the method must decide whether the wafer that is leaving the KWLL is going to be sent to the FI as the target space or the tool is the target space. As step 408, the method queries whether the FI is the target space for the wafer leaving the KWLL. If the query, at step 408, is answered affirmatively, then the method proceeds to step 410 where the KWLL must be vented before the wafers can be moved from the KWLL to the FI load port. At step 410, the venting is finished and the wafers are loaded and unloaded. Additionally, in step 410, the processed wafer count is decremented by one for each wafer that is unloaded. At step 412, the vent is finished and the KWLL can be loaded from wafers within the load port of the FI. As such, the KWLL will then be a target chamber for wafers coming from the FI.

If, at step 408, the query is negatively answered, the method 400 proceeds to step 414. At step 414, the method takes the unprocessed wafers from the load lock and places them in the tool and puts processed wafers into the load lock according to a scheduling algorithm for the tool. The method then decrements the unprocessed wafer count by one for each unprocessed wafer that is removed from the load lock. At step 416 and 428, the method tests the unprocessed wafer count and the processed wafer count respectively to see if the KWLL is full of either processed or unprocessed wafers. If, at step 416, the method finds the wafer count of processed wafers equal to K−1, the method deems the KWLL is filled with the processed wafers that are ready to be moved into the FI load port. As such, the method proceeds to step 420 where the KWLL is vented. If, at step 416, the processed wafer count is not equal to K−1, the method proceeds to step 418. At step 418, the method queries whether there are more wafers in the tool. If there are not, the method proceeds to step 420 and vents the KWLL. If additional wafers are left in the tool, the method proceeds to step 402.

If, at step 428, the method finds the wafer count of unprocessed wafers is equal to K−1, then the method deems the KWLL as being full of unprocessed wafers and ready to be pumped to vacuum such that the tool can access and remove the unprocessed wafers in step 432. If the unprocessed wafer count is not equal to K−1, the method proceeds from step 428 to step 430 where the method queries whether there are unprocessed wafers in the FI load port. If there are no wafers available in the load port, the method proceeds to step 432 and pumps the KWLL to vacuum. However, if there are unprocessed wafers in the FI load port at step 430, the query is answered affirmatively and the method 400 proceeds to step 402.

If, at step 402, the KWLL is deemed the target chamber for the wafers, the query, at step 402, is then answered affirmatively and the method 400 proceeds to step 424. At step 424, the method queries whether the FI is the source space for the wafers that are being transferred to the KWLL. If the query, at step 424, is answered affirmatively, the method proceeds to step 426 where a wafer is placed from the FI load port into the KWLL and the unprocessed wafer count is then incremented. The method 400 then proceeds to step 428 to determine when the unprocessed wafer count is equal to K−1 and the KWLL is ready for pumping.

If, at step 424, the FI is deemed not to be the source space, i.e., the wafers are coming from the tool. The method 400 proceeds to step 422. At step 422, wafers are put into the load lock from the tool and the processed wafer count is incremented. The method then proceeds to step 416 to determine when the processed wafer count is equal to K−1 such that the KWLL is deemed full and ready to be vented such that the wafers can be moved to the FI load port.

The foregoing method 400 is used to efficiently move wafers from the FI load port to the tool and from the tool to the FI load port using the KWLL.

K-wafer

Wafer-packing Loading Policy

For a given FI and tool configuration and process and robot parameters, there are three additional variables that may affect the system throughput and cassette cycle time considerably. These are, 1. Scheduling algorithms in the FI and tool's robot space;
2. Load-lock capacity (maximum number of wafers that can be transported from one robot space to another); and
3. Load-lock loading policy (the rules and conditions under which pump and vent are initiated).

The above three variables interact in a complex manner and, for best system performance, a number of simulation experiments are needed before the load-lock capacity is decided and loading policy and scheduling algorithms are implemented. The "wafer packing" load-lock loading policy tries to maximize the number of wafers in the tool at any given point in time. Thus there is no waiting for processed wafers (in order for KWLL to go into vent) when there are wafers ready to be processed outside the tool. The term "wafer packing" is borrowed from a body of priority-based scheduling algorithm for cluster tools which have similar objective and behavior, see U.S. Pat. No. 5,928,389, issued Jul. 27, 1999 and U.S. Pat. No. 6,074,443, issued Jun. 13, 2000.

In general, the KWLL will be pumped if any of the following conditions hold true:
1. The load-lock is loaded with K unprocessed wafers (regardless of the conditions inside the tool);
2. There are 0<m<K unprocessed wafers in the load-lock but no additional wafers in the FI waiting to be moved into the tool; or
3. There are no unprocessed wafers in the load-lock, no wafers waiting to enter the load-lock, but there are wafers being processed in the tool that need to be moved into the FI (i.e., empty the tool).

And the KWLL will be vented if any of the following conditions hold true:
1. There are no unprocessed wafers in the load-lock and there are unprocessed wafers in the FI waiting to enter the tool;
2. There are no unprocessed wafers in the FI but the load-lock is completely filled with processed wafers waiting to enter the FI robot space (emptying the tool); or
3. There are no unprocessed wafers in the FI, there are 0<m<K processed wafers in the load-lock, and no more wafers being processed in the tool (i.e., empty the tool).

Figure 5:
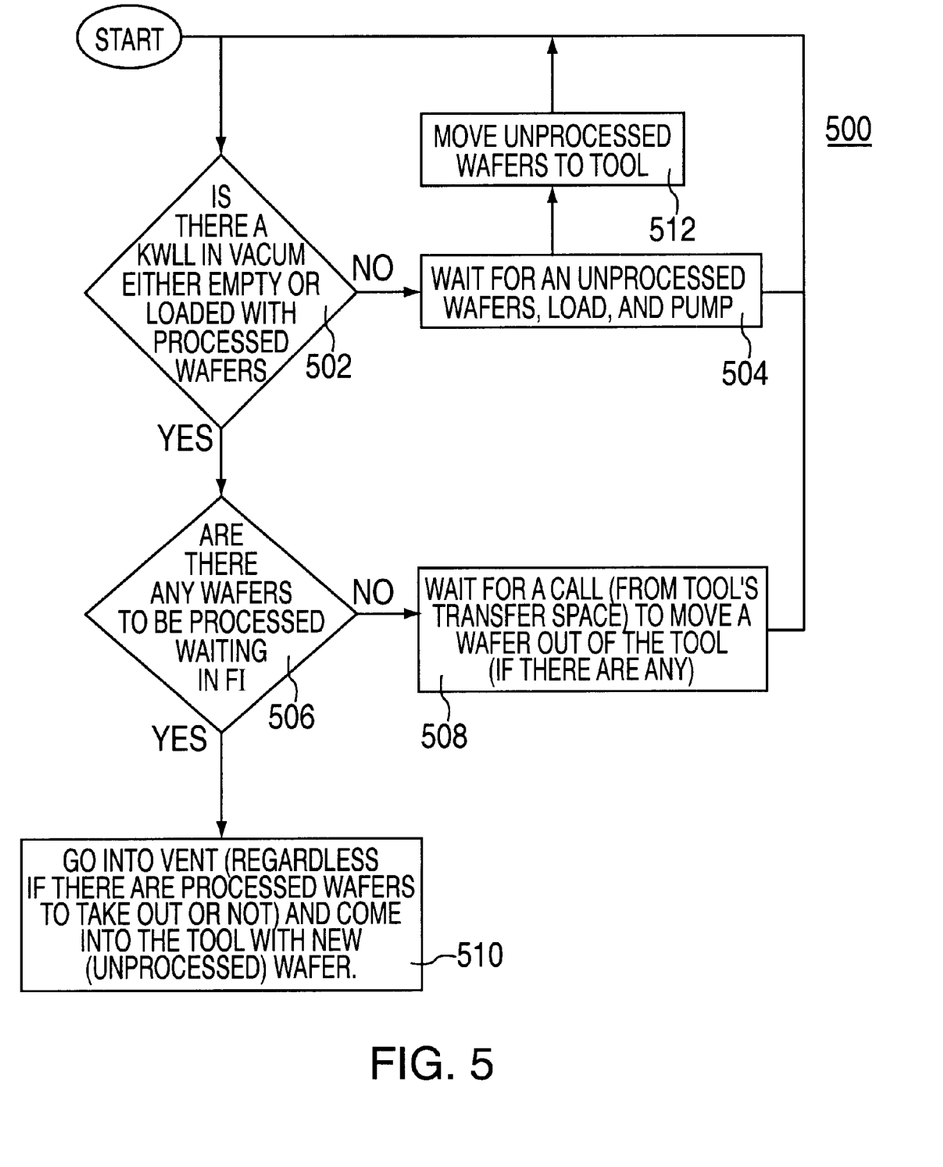
FIG. 5 depicts a flow diagram of a wafer packing loading method of transferring a wafer through a KWLL.

FIG. 5 is a flow diagram of the KWLL wafer-packing loading method 500 in steady state, i.e., after the KWLL has been filled with K wafers. At step 502, the method 500 queries whether the KWLL is presently in the vacuum and is either empty or loaded with K processed wafers. This query is intended to test whether the KWLL is ready to leave the vacuum state and be vented. If the answer to the query, at step 502, is negative, then the method 500 proceeds to step 504 where the KWLL is deemed to be not in a vacuum. At step 504, the KWLL waits for unprocessed wafers to be loaded into the KWLL and then the KWLL is pumped to vacuum. Once the vacuum is produced in the KWLL, the method 500 moves to step 512 wherein the unprocessed wafer are moved to the tool by the tools transport agent. The method 500 then returns to step 502 to again test whether the KWLL is in vacuum and either empty or loaded with processed wafers.

If the query, at step 502, is affirmatively answered, the method 500 proceeds to step 506 where the method queries whether there are any wafers to be processed waiting in the FI. If there are no wafers waiting in the FI, the method 500 proceeds to step 508 where the KWLL is left in vacuum and awaits a call from the tool transfer agent to move processed wafers from the tool and into the KWLL. There is no reason why the KWLL should be vented because there are no wafers waiting to be moved into the tool from the FI. After step 508, the method 500 returns to step 502. If, at step 506, there are wafers waiting to be processed in the FI, method 500 proceeds to step 510 where the KWLL is vented regardless of whether there are processed wafers to be removed from the KWLL or not and new unprocessed wafers are loaded from the FI into the KWLL. The wafers may originate in the FI from any position outside of the tool including metrology chambers, orient chambers, the load ports, and the like.

K-wafer

Reactive Loading Policy

In a "reactive" loading method, the load-lock would wait for processed wafers to be loaded (from tool's robot space) in order to initiate a "vent" cycle. That is true, as long as there are wafers being processed by the cluster tool. As in the case with the wafer packing load method, the pump process is initiated to bring in new wafers (if there are any). If there are not any unprocessed wafers waiting in the FI, the load-lock still may go into a pump cycle (this time empty) in order to remove processed wafers from the tool's robot space. In other words, the pump and vent cycles are initiated to "react" to the state of the tool and the FI.

The reactive loading method will pump the KWLL if any of the following conditions hold true:
1. The load-lock is completely filled with unprocessed wafers;
2. There are 0<m<K unprocessed wafers in the load-lock but no additional wafers in the FI waiting to be moved into the tool; or
3. The load-lock is empty and there are no wafers waiting to enter the load-lock, but there are wafers being processed in the tool (i.e., empty the tool).

The method will vent the KWLL if any of the following conditions hold true:
1. There are K processed wafers in the load-lock (this is regardless if there are unprocessed wafers in the FI waiting to enter the tool), or
2. There are 0<m<K processed wafers in the load-lock, and no more wafers are being processed in the tool (i.e., empty the tool).

Figure 6:
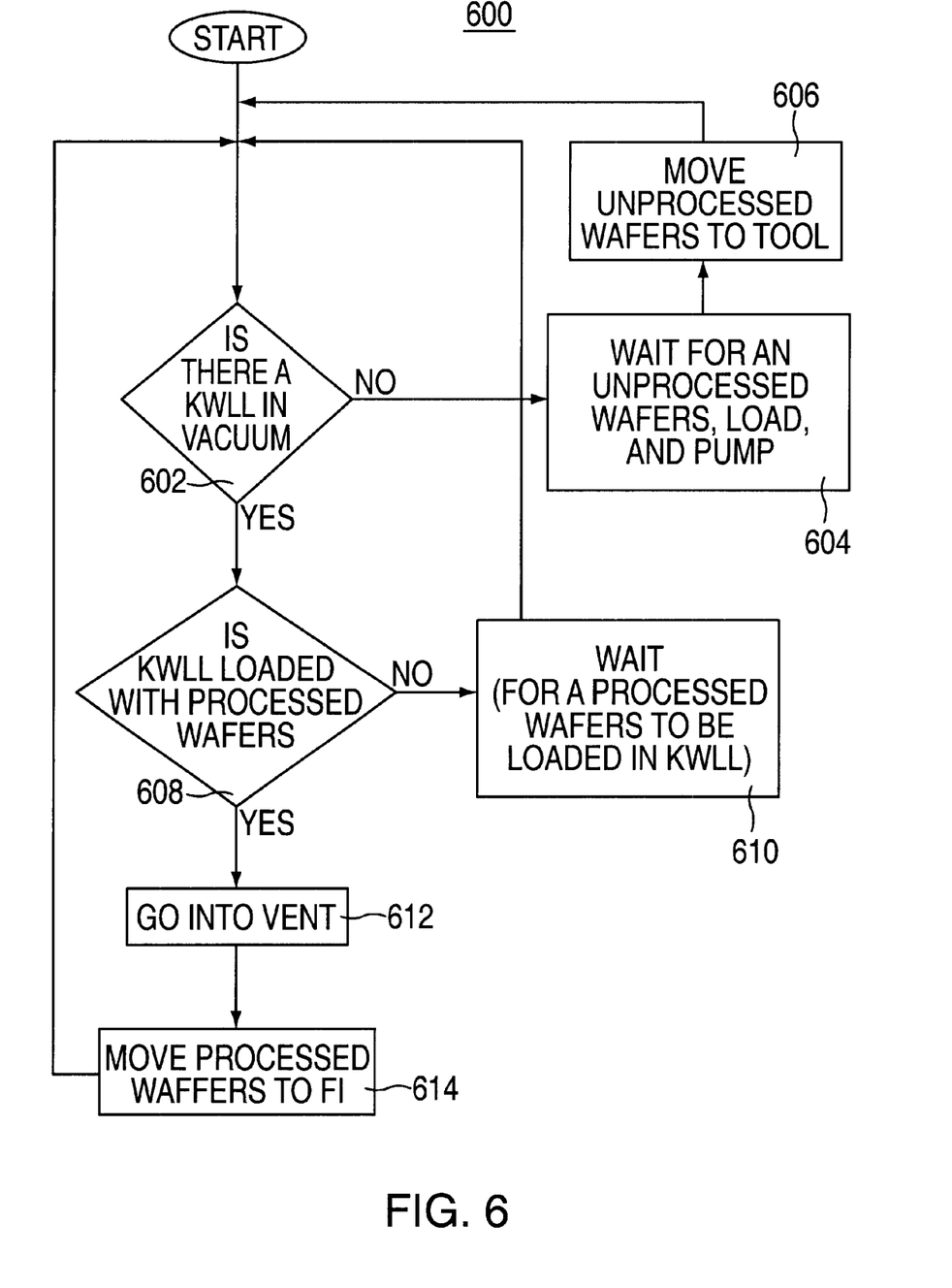
FIG. 6 depicts a flow diagram of a reactive loading method of transferring a wafer through a KWLL.

FIG. 6 depicts a reactive loading method 600 for transporting wafers into and out of the KWLL. The method 600 begins at step 602 with a query of whether the KWLL is in vacuum. If the KWLL is not in vacuum, i.e., is vented, then the method 600 proceeds to step 604. At step 604, the method waits for unprocessed wafers to be loaded into the KWLL and the KWLL is pumped to vacuum. The method 600 then proceeds to step 606 where the unprocessed wafers are moved to the tool. The method 600 then returns to step 602 to test again whether the KWLL is in vacuum. If step 602 is answered affirmatively, the method 600 proceeds to step 608 where the method queries whether the KWLL is loaded with the processed wafers. If the KWLL is not loaded with processed wafers, i.e., does not contain K wafers, the method 600 proceeds to step 610 where the KWLL waits for processed wafers to be loaded into the KWLL. After the processed wafers have been loaded into the KWLL, the method 600 returns to step 602. If, at step 608, the KWLL is deemed to be loaded with processed wafers, the method proceeds to step 612 where the KWLL is vented. The method then proceeds to step 614 where the processed wafers are moved from the KWLL to the FI. The method 600 then returns to step 602.

"γ-tolerant" Load-lock Loading Policy

In a "wafer-packing" loading method, the "vent" state is initiated whenever there are no unprocessed wafers in the KWLL. That is, KWLL begins a vent cycle either empty, partly loaded or fully loaded with processed wafers. If there are no wafers, the method will not wait. In the "reactive" loading method, the vent cycle is initiated only if the KWLL is filled with processed wafers (in steady state) or partially filled (when emptying the system).

A Gamma-tolerant loading method establishes a threshold for waiting before initiating a vent cycle. This is best Illustrated on a single-wafer load-lock (SWLL) i.e., a KWLL with K=1. Let $T_{travel}:=T_{vent}+T_{pump}+T_{load/unload}$ and let $T_{waiting}$ be the load-lock waiting time before a processed wafer is loaded (transferred from a chamber into the SWLL). Now if, $T_{travel}<T_{waiting}$, a load-lock can be empty when a vent cycle begins, as well as bring a new (i.e., unprocessed) wafer from the FI and still not be late to remove a processed wafer from of the tool. However, if $T_{travel}>T_{waiting}$, it is not clear if an empty SWLL should initiate a vent cycle or not. The reason is that: 1) another load-lock may be available to remove the wafer, or 2) the difference $|T_{travel}-T_{waiting}|$ may be significant, or 3) even if the difference $|T_{travel}-T_{waiting}|$ is significant, the pending action (i.e., wait for a processed wafer or initiate a vent cycle with the SWLL empty) when executed would increase the throughput rather than adversely affecting the throughput.

For a KWLL, the gamma tolerant loading method must take into consideration the number of wafers that can be loaded or unloaded from the KWLL during the waiting time $T_{waiting}$ and the number of wafers currently loaded in the KWLL. As such, if the travel time $T_{travel}$ is less than $T_{waiting}$ for one or more wafers, the KWLL can be used to load and unload wafers while awaiting a processed wafer to be ready for loading from the tool. Consequently, the travel time is now represented by $T_{travel}=T_{vent}+T_{pump}+T_{load/unload}$ (M), where M is the number of wafers that are to be loaded and unloaded into the KWLL during the period $T_{travel}$. The number of wafers in the KWLL is represented as a wafer load level variable $W_L$ and must be greater than a threshold beta (β) to initiate a vent and pump cycle. β is set at a level that makes initiating the pump and vent cycle worth while.

The idea behind a family of gamma-tolerant algorithms is to set a threshold value γ (gamma) so that if the ratio $T_{waiting}/T_{travel}$ is greater than γ and the variable $W_L$ is greater than γ, then load-lock should initiate a vent cycle, else it should wait for an additional wafer or wafers from the tool and then initiate a vent procedure. The value of gamma and beta is determined upon an exhaustive simulation of system throughput before being set in the cluster-tool control system.

Figure 7:
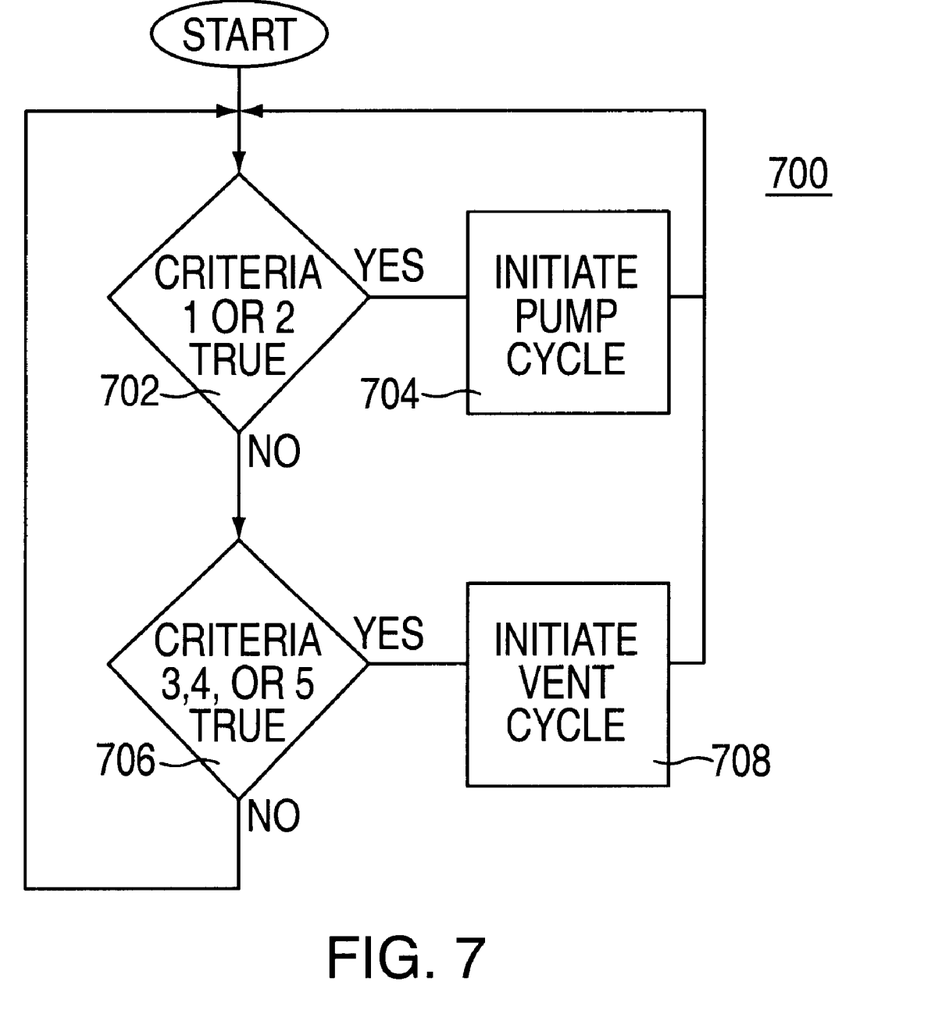
FIG. 7 depicts a flow diagram of a "gamma tolerant" loading method of transferring a wafer through a KWLL.

FIG. 7 depicts a flow diagram of a KWLL "gamma-tolerant" loading method 700. At step 704, the method 700 initiates a pump cycle if any of the following conditions hold true at step 702:
1. The load-lock is loaded with unprocessed wafers (regardless of the conditions inside the tool); or
2. There are no unprocessed wafers in the load-lock, no wafers waiting to be loaded into the load-lock, but there are wafers being processed in the tool that should be removed after being processed (i.e., empty the tool).

and, at step 708, the method 700 initiates a vent cycle if any of the following conditions hold true at step 706:
1. $T_{waiting}/T_{travel}>\beta$, $W_L>\gamma$ and there are unprocessed wafers in the FI waiting to be loaded into the tool;
2. There are no unprocessed wafers in the FI but the load-lock is completely filled with processed wafers waiting to be moved into the FI robot space (i.e., emptying the tool); or
3. There are no unprocessed wafers in the FI, there are 0<m<K processed wafers in the load-lock, and no more wafers being processed in the tool (i.e., empty the tool).

Since tool configurations and parameters (e.g. number of chambers and chamber process time) tend to change as the process is altered to meet the needs of various products and device geometries, there is a need for being able to deploy various load-lock loading methods to match the configuration and scheduling algorithm for the highest throughput. Since the option should be possible in the same version of software, this is best accomplished by using a pull-down menu of various loading methods (e.g. reactive, wafer-packing, gamma-tolerant, and the like). Whenever there are changes in either system configuration or parameters or both, a throughput simulation program should be run and best loading policy for the given configuration and parameters should be established. That loading method should then be inserted into the tool's control system and software by "point and click". Technically, the "point and click" insertion is accomplished by using a case statement, where each loading method is represented by a different case (the case is then chosen by passing an integer or a string from the user interface). For gamma-tolerant methods, once the policy is chosen as gamma-tolerant, the value of gamma is inserted from a separate field in the user interface.

While foregoing is directed to the preferred embodiment of the present invention, other and further embodiments of the invention may be devised without departing from the basic scope thereof, and the scope thereof is determined by the claims that follow.

What is claimed is:

1. A method for performing wafer packing in a system for fabricating integrated circuits that use a K-wafer load-lock (KWLL), where K is an integer greater than one, to facilitate moving wafers from a factory interface to a cluster tool comprising:

if the KWLL does not contain a vacuum and the KWLL is empty, waiting for unprocessed wafers, loading the unprocessed wafers into the KWLL, and pumping the KWLL to vacuum, then moving the unprocessed wafers to the cluster tool;

if the KWLL does contain a vacuum or is loaded with processed wafers, checking whether a factory interface contains any unprocessed wafers;

if there are unprocessed wafer in the factory interface, venting the vacuum and loading unprocessed wafers into the KWLL; and if there are no wafers waiting in the factory interface, waiting for a call from the tool and move wafers from the KWLL into the cluster tool.

2. The method of claim 1, further comprising loading up to K−1 wafers into said KWLL.

3. The method of claim 1, further comprising:

if the KWLL does contain a vacuum, checking whether the KWLL is loaded with processed wafers;

if the KWLL is not loaded with processed wafers, waiting for the processed wafers to be loaded into the KWLL; and if the KWLL is loaded with processed wafers, venting the KWLL and move the processed wafers to the factory interface.

4. The method of claim 1, further comprising:

initiate pumping the KWLL if the KWLL is loaded with unprocessed wafers or there are no unprocessed wafers in the KWLL and no wafers waiting to be loaded in the KWLL, but there are wafers being processed in the cluster tool;

determine a number of wafers in the KWLL;

computing $T_{waiting}$ as a period of time before a processed wafer or wafers are ready for loading into the KWLL;

computing $T_{travel}$ as a period of time required for the KWLL to be vented, pumped, and the wafers loaded and unloaded from the KWLL;

initiate venting the KWLL if: (a) $T_{witing}/T_{travel}$ is greater than a first predefined value, the number of wafers in the KWLL is greater than a second predefined variable and there are unprocessed wafers waiting to be loaded into the KWLL, (b) there are no unprocessed wafers waiting to be loaded in the KWLL, but the KWLL is full of processed wafers, (c) there are no unprocessed wafers waiting to be moved into the KWLL, there are between zero and K processed wafers in the KWLL, and no more wafers are being processed in the cluster tool.

5. A computer readable medium for storing software that, when executed by a processor, causes a system for fabricating integrated circuits that uses a K-wafer load-lock (KWLL), where K is an integer greater than one, to facilitate moving wafers from a factory interface to a cluster tool to perform a method comprising:

if the KWLL does not contain a vacuum and the KWLL is empty, waiting for unprocessed wafers, loading the unprocessed wafers into the KWLL, and pumping the KWLL to vacuum, then moving the unprocessed wafers to the cluster tool;

if the KWLL does contain a vacuum or is loaded with processed wafers, checking whether a factory interface contains any unprocessed wafers;

if there are unprocessed wafer in the factory interface, venting the vacuum and loading unprocessed wafers into the KWLL; and if there are no wafers waiting in the factory interface, waiting for a call from the tool and move wafers from the KWLL into the cluster tool.

6. The method of claim 5, further comprising loading up to K−1 wafers into said KWLL.

7. The method of claim 5, further comprising:

if the KWLL does contain a vacuum, checking whether the KWLL is loaded with processed wafers;

if the KWLL is not loaded with processed wafers, waiting for the processed wafers to be loaded into the KWLL; and if the KWLL is loaded with processed wafers, venting the KWLL and move the processed wafers to the factory interface.

8. The method of claim 5, further comprising:

initiate pumping the KWLL if the KWLL is loaded with unprocessed wafers or there are no unprocessed wafers in the KWLL and no wafers waiting to be loaded in the KWLL, but there are wafers being processed in the cluster tool;

determine a number of wafers in the KWLL;

computing $T_{waiting}$ as a period of time before a processed wafer or wafers are ready for loading into the KWLL;

computing $T_{travel}$ as a period of time required for the KWLL to be vented, pumped, and the wafers loaded and unloaded from the KWLL;

initiate venting the KWLL if: (a) $T_{witing}/T_{travel}$ is greater than a first predefined value, the number of wafers in the KWLL is greater than a second predefined variable and there are unprocessed wafers waiting to be loaded into the KWLL, (b) there are no unprocessed wafers waiting to be loaded in the KWLL, but the KWLL is full of processed wafers, (c) there are no unprocessed wafers waiting to be moved into the KWLL, there are between zero and K processed wafers in the KWLL, and no more wafers are being processed in the cluster tool.

* * * * *

UNITED STATES PATENT AND TRADEMARK OFFICE
CERTIFICATE OF CORRECTION

PATENT NO. : 6,684,123 B2
DATED : January 27, 2004
INVENTOR(S) : Jevtic et al.

It is certified that error appears in the above-identified patent and that said Letters Patent is hereby corrected as shown below:

Column 10,
Line 56, please change "$T_{waiting}/T_{travel} > ß$, $W_L > γ$" to -- $T_{waiting}/T_{travel} > γ$, $W_L > ß$ --.

Signed and Sealed this

Twenty-fifth Day of May, 2004

JON W. DUDAS
*Acting Director of the United States Patent and Trademark Office*